(12) United States Patent  (10) Patent No.: US 6,788,542 B2
Rumney  (45) Date of Patent: Sep. 7, 2004

(54) HINGED COVER FOR RACK-MOUNTABLE MODULE

(75) Inventor: Gary Rumney, Leighton Buzzard (GB)

(73) Assignee: Sun Microsystems, Inc., Santa Clara, CA (US)

( * ) Notice: Subject to any disclaimer, the term of this patent is extended or adjusted under 35 U.S.C. 154(b) by 51 days.

(21) Appl. No.: 10/217,156

(22) Filed: Aug. 12, 2002

(65) Prior Publication Data

US 2004/0027808 A1 Feb. 12, 2004

(51) Int. Cl.$^7$ ................................................ H05K 5/03
(52) U.S. Cl. ........................ 361/724; 361/724; 361/725
(58) Field of Search .......................... 361/681, 724–727

(56) References Cited

U.S. PATENT DOCUMENTS 6,181,552 B1 * 1/2001 Neville, Jr. et al. ......... 361/686
6,233,158 B1    5/2001 Leman
6,351,374 B1    2/2002 Sherry
6,492,974 B1 * 12/2002 Nobuchi et al. ............ 345/156
6,595,605 B1    7/2003 Babcock et al.

* cited by examiner

Primary Examiner—Darren Schuberg
Assistant Examiner—Yean-Hsi Chang
(74) Attorney, Agent, or Firm—Meyertons Hood Kivlin Kowert & Goetzel, P.C.; B. Noël Kivlin

(57) ABSTRACT

A cover for a access opening in a face of a housing of an electronic circuit module for a rack-mounted circuit is described, wherein the cover is pivotable to overlie a part of the face of the housing adjacent to an access opening closed by the cover. A hinge assembly for such a cover is described.

8 Claims, 6 Drawing Sheets

HINGED COVER FOR RACK-MOUNTABLE MODULE

BACKGROUND OF THE INVENTION

The present invention relates to housings for electronic circuits, and is primarily concerned with providing inspection and maintenance access to the circuitry enclosed by such housings. Specifically, the invention is concerned with a housing having an access opening in one face and a hinged cover for the opening, the cover being mounted for swinging through an arc of substantially 180 degrees to lie, when opened, on the face of the housing adjacent to the access opening. The cover provides clear access to the interior of the housing when opened, and electromagnetic shielding of the components when closed.

SUMMARY OF THE INVENTION

An aspect of the present invention provides a housing for an electronic circuit, wherein the housing has a substantially planar face and an access opening in said face, and the housing comprising a cover pivotally mounted for movement between a first position substantially in the plane of said face and covering the access opening and a second position wherein the cover overlies a region of said face adjacent to the access opening.

Another aspect of the invention provides a rack-mounted modular electronic circuit comprising a supporting structure or rack and a number of circuit modules mounted in the rack, at least one module having a housing with a substantially planar face and an access opening in said face, and the housing comprising a cover pivotally mounted for movement between a first position substantially in the plane of said face and covering the access opening and a second position wherein the cover overlies a region of said face adjacent to the access opening.

In a particular embodiment, the modules are mounted to the rack for movement between an operating position in which the modules are substantially within the rack, and a service position in which the module is supported outside the rack. The modules may be mounted for sliding movement between their operating and service positions.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
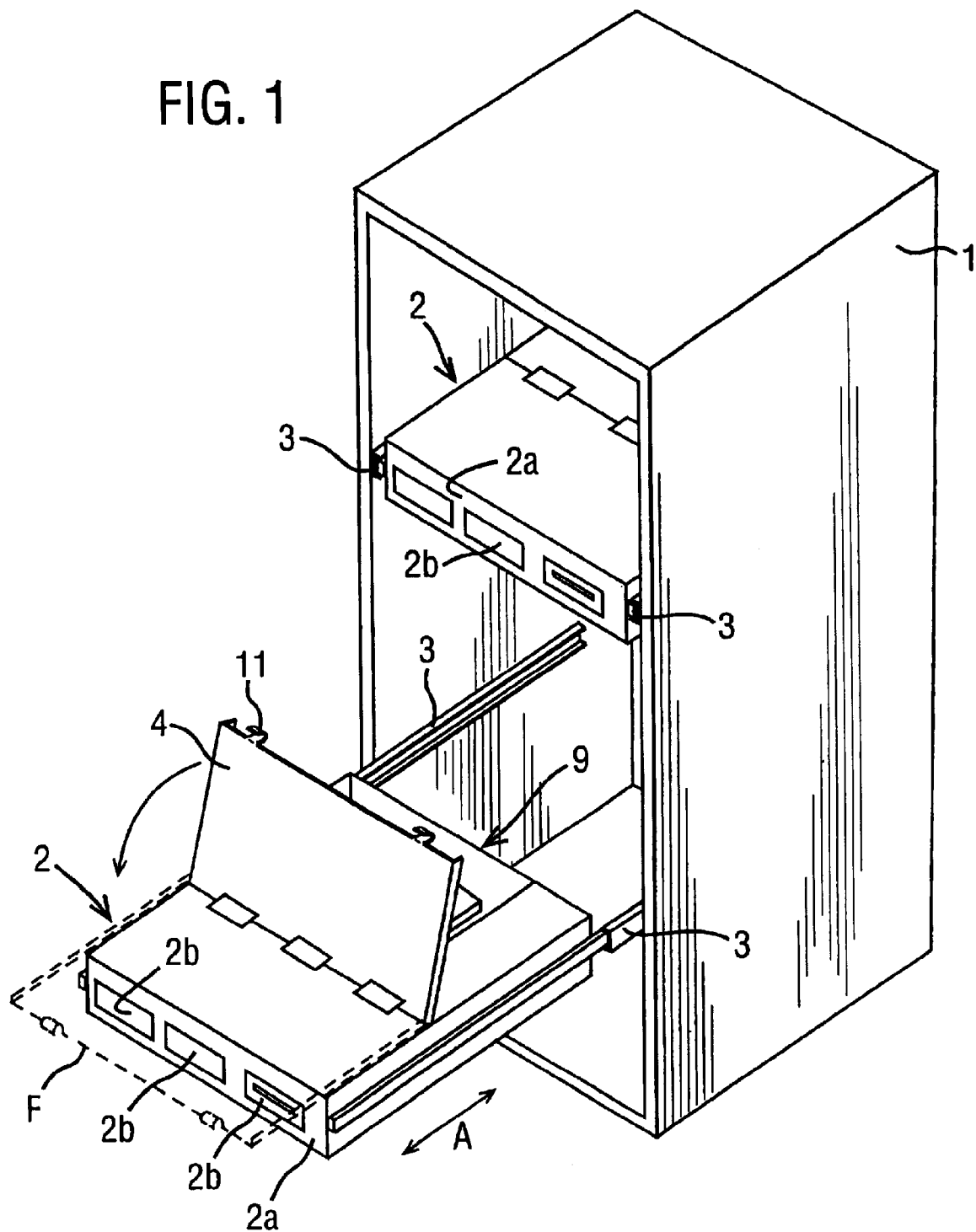
FIG. 1 is a perspective view of a rack-mounted system comprising two electronics modules.

Referring now to the drawings, in which like reference numerals are used to designate corresponding elements, FIG. 1 is a perspective view showing a supporting structure or rack, in which two electronics modules 2 are mounted on slide rails 3. The modules 2 are slidable in the directions shown by the arrow A. The width of the modules is arranged so that they fit in a standard 19 inch rack, and the height of the modules is 1.75 inches. It is however foreseen that the housing may have a height which is a multiple of 1.75 inches.

Each module 2 comprises a substantially rectangular housing having a front face 2a on which components 2b requiring access during operation of the module are mounted. Such components include disk drives, card drives, and status indicators such as lamps or displays. To the rear face 9 of the module are mounted cable connectors and power supply inlets and the like, to provide power to the module and to provide connectivity between the modules 2 in a rack 1. Each module has on its upper face (as seen in the Figure) a hinged access cover 4 to enable a service operative to access the internal circuit components of the module 2.

The upper of the two electronics modules 2 of FIG. 1 is shown in its operating position, while the lower module 2 is shown in its servicing position, with the lower module slid forwardly out of the rack 1 and its servicing cover 4 partially opened. The fully opened position of the cover 4 of the lower module 2 is shown in phantom lines and referenced F.

While only two electronics modules are shown in the rack 1, it will be understood that the rack 1 may contain a single module 2 or a plurality of three or more modules 2. In the embodiment shown, the modules 2 are generally planar and are mounted in a horizontal orientation with their respective hinged covers uppermost. In an alternative embodiment, an access cover 4 may be provided additionally, or alternatively, on the underside of the module 2. It is to be further understood that in a yet further alternative embodiment the modules 2 may be mounted in a generally vertical orientation and have their hinged covers 4 on one or both of their respective side surfaces, so that the cover or covers each swing about a substantially vertical axis.

Figure 2:
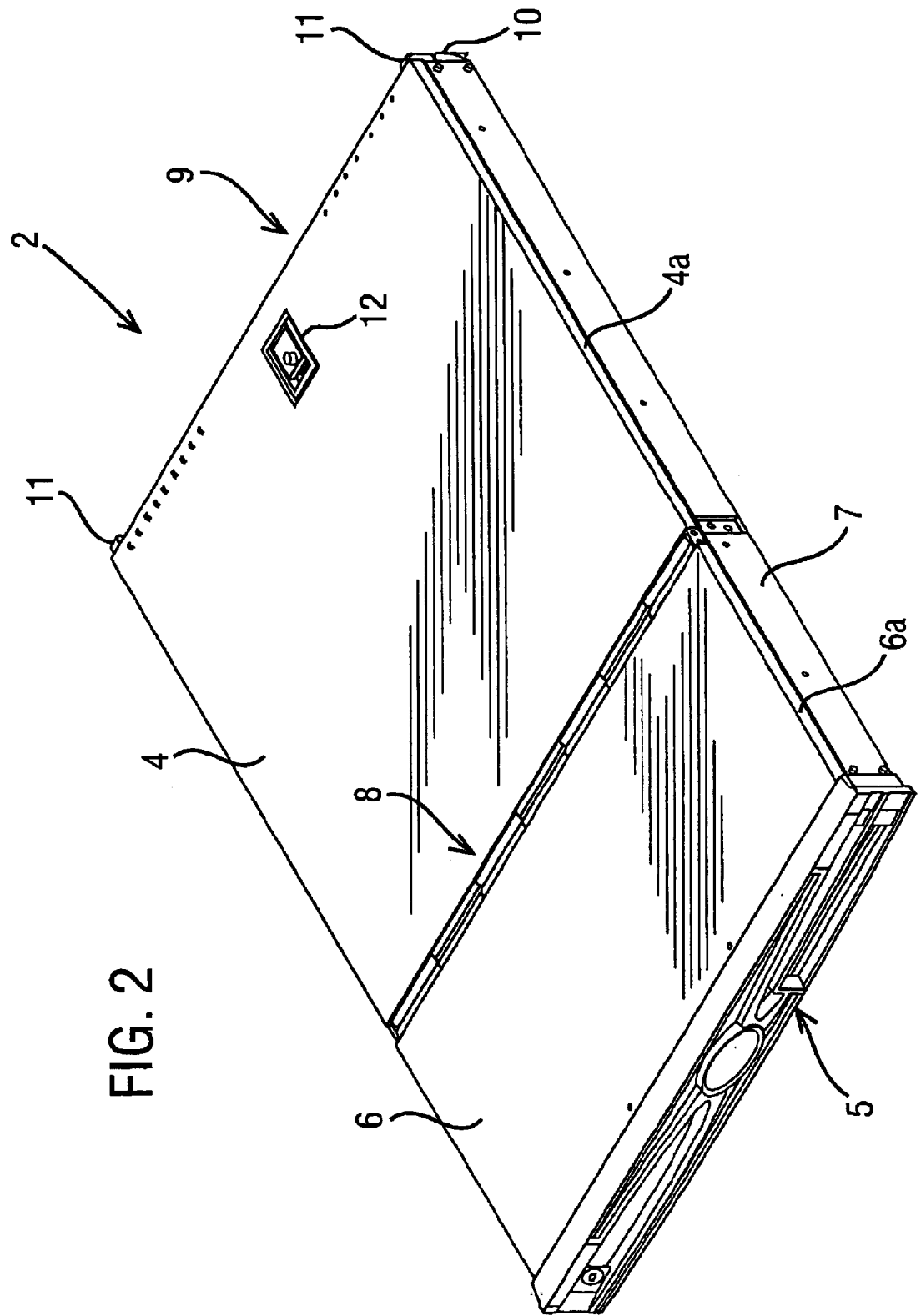
FIG. 2 is a perspective view of an electronics module with its cover closed.

FIG. 2 is a perspective view of a module 2 removed from the rack 1. The slide rails 3 are also removed for clarity. The module 2 has a decorative fascia panel 5 mounted to its front face, the fascia panel 5 being hingedly mounted to the module 2 so that it can be swung down to afford access to disc drives etc., mounted on the front of the module. The upper face of the module 2 is constituted by a fixed panel 6 and the hinged cover 4. The fixed panel 6 has depending side pieces 6a which extend downwardly, enclosing the upper parts of sidewalls 7 of the module 2.

The rear part of the upper face of the module 2 is closed by the cover 4, which extends from a hinge 8 to the rear face 9 of the module. The cover 4 has depending side pieces 4a which overlie the upper parts of sidewalls 7 of the module 2 when the cover 4 is closed.

The housing, cover 4 and fixed panel 6 are formed from sheet metal, of thickness from about 0.75 mm to 1.5 mm. The metal may be zinc-plated or painted steel or other suitable material to effect electromagnetic shielding of the circuits in the housing.

At the ends of the rear face 9 of the module 2, a pair of toggle fasteners 10 are mounted to the rear face 9 to engage with hook projections 11 on the rear end edge of the cover 4. In order to maintain the central part of the cover 4 in close engagement with the rear face 9 of the module 2, a latch element 12 is mounted to the cover 4 to engage a flange 13 extending inwardly from the rear face 9 of the module. It will of course be understood that the latch 12 could alternatively engage a detent mounted on the lower face of the module 2, to extend upwardly. The latch element 12 may be a simple resilient latch, or may be a key-operated or tool-operated latch. If the latch 12 is operable without the use of tools or keys, then unauthorised personnel are not prevented from opening the cover 4. In order that qualified service personnel only should open the cover 4, the latch 12 may be key-or tool-operated.

Figure 3:
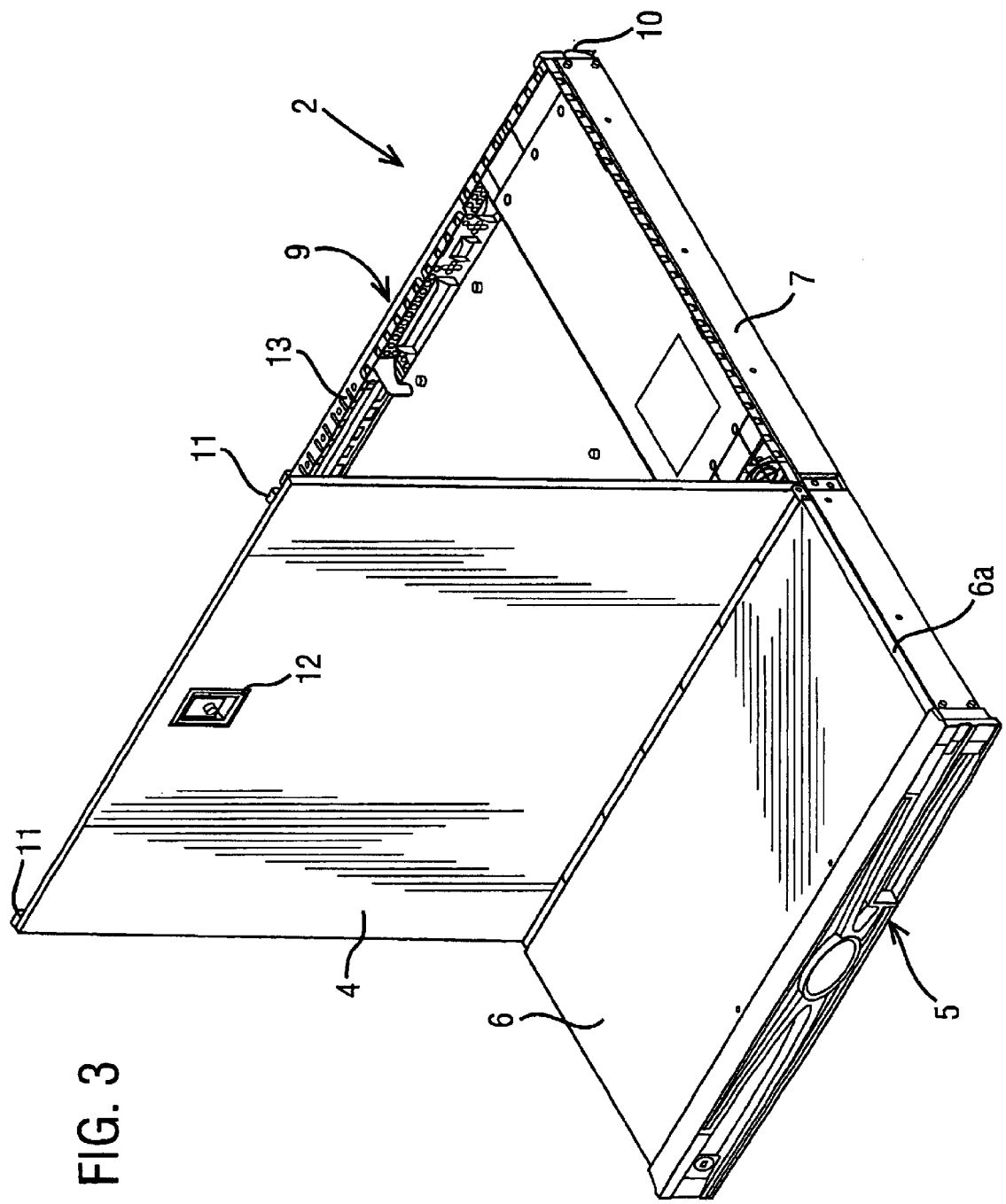
FIG. 3 is a perspective view of an electronics module with its hinged cover partially opened.
Figure 4:
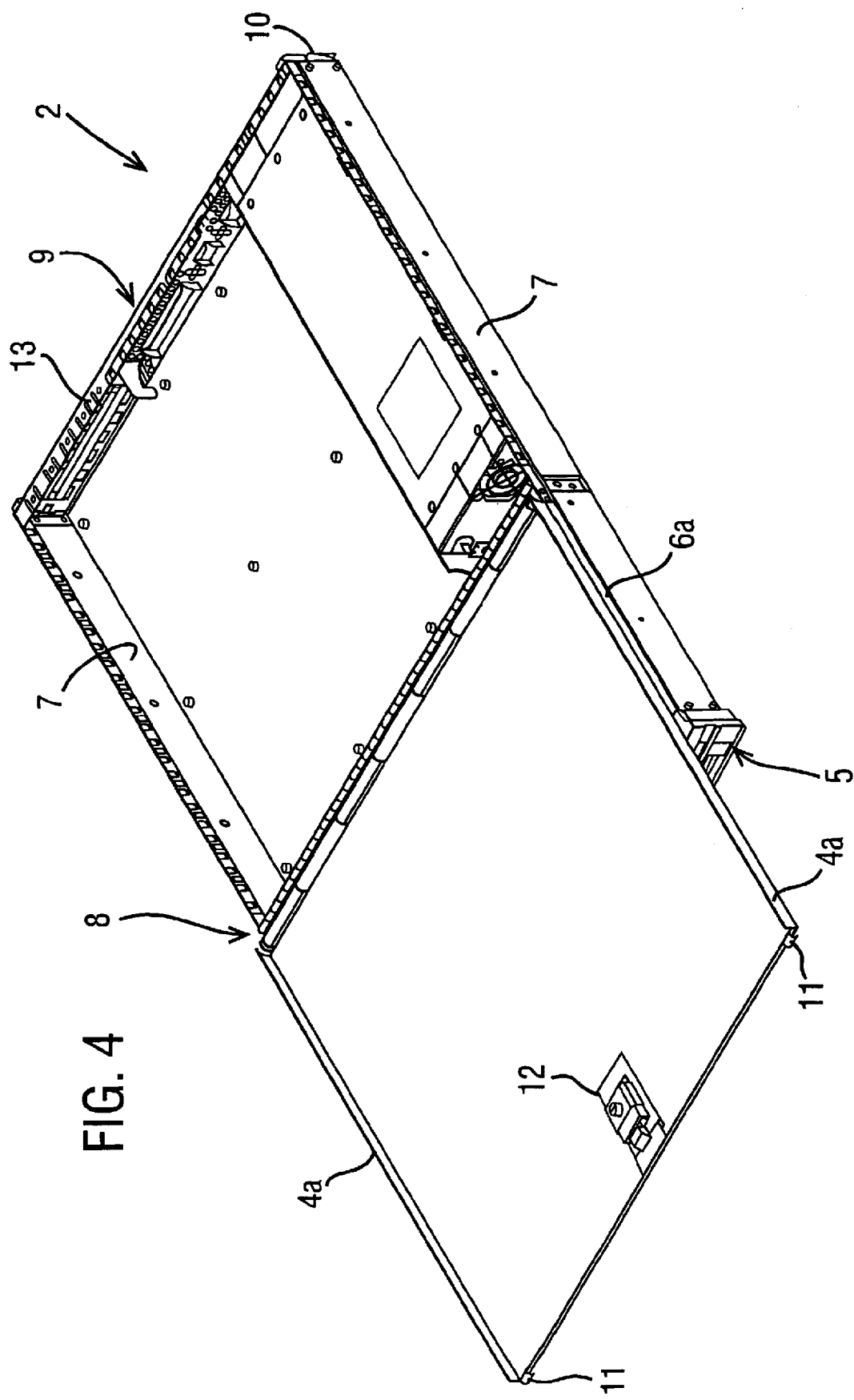
FIG. 4 is a perspective view similar to FIG. 3 showing the cover fully open.

FIGS. 3 and 4 are views similar to FIG. 2, showing the cover 4 in an intermediate position in FIG. 3, and in its fully opened position in FIG. 4. In the opened position in FIG. 4, the cover 4 overlies the fixed panel 6 on the upper surface of the module 2. In order to provide effective support for the cover 4 in its fully opened position, the hinge 8 is positioned in the upper face of the module 2 so that the distance from the hinge 8 to the front of the module 2 is approximately half the distance from the hinge 8 to the rear face 9. When the cover 4 is opened, as shown in FIG. 4, the interior surface of the cover 4 may be used as a space for storing light components, or may be used to carry servicing instructions which are available to the service operative once the cover 4 is opened. In the embodiment shown, the front face of the module 2 is situated beneath the midpoint of the cover 4, so that inadvertent pressure on the overhanging part of the cover 4 does not result in unsupportable bending moments in the cover. It is clear from the position shown in FIG. 4 that the fully opened position of the cover affords substantially uninterrupted access to the interior of the module 2 between the hinge 8 and the rear face 9.

Figure 5:
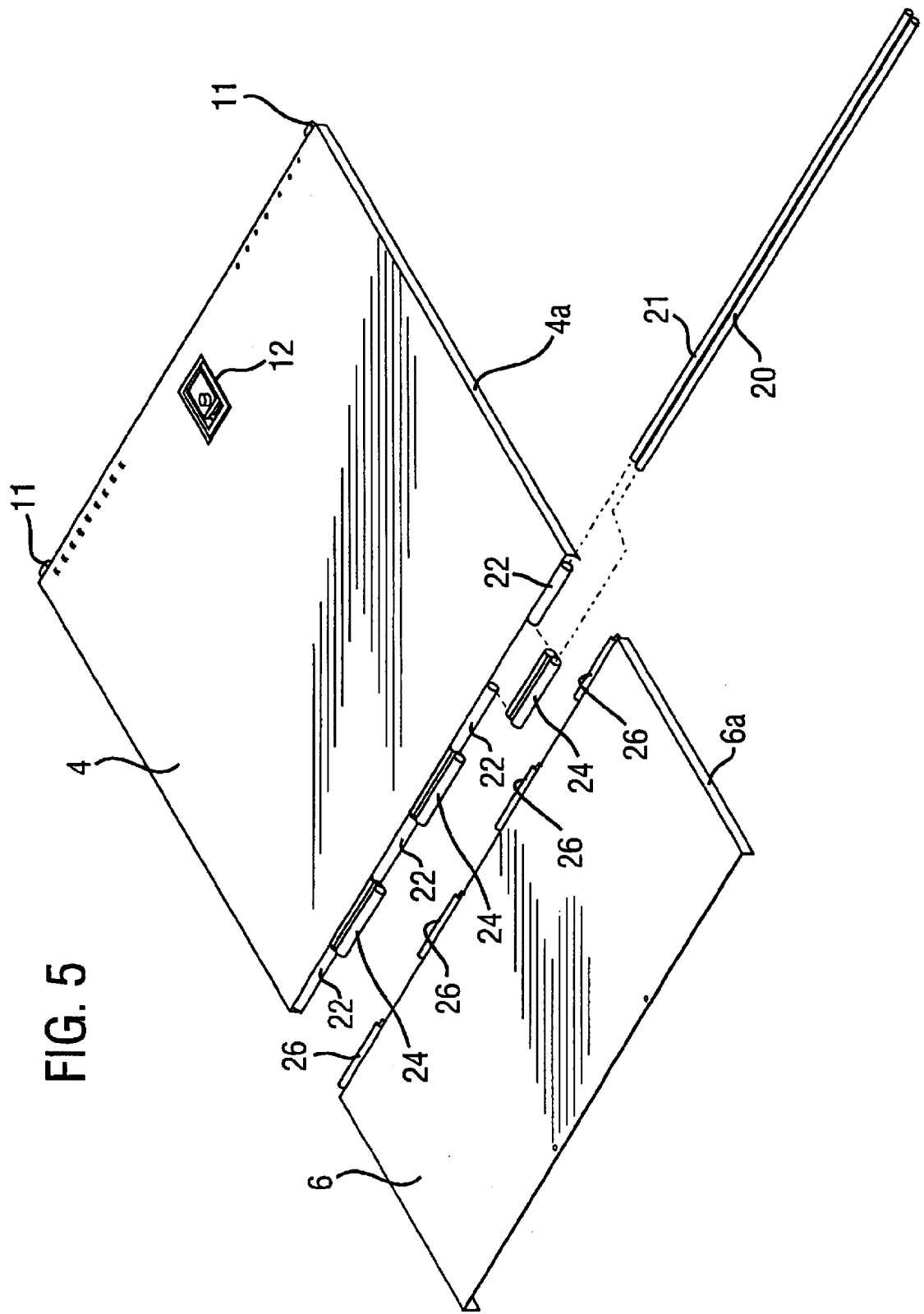
FIG. 5 shows the hinge structure exploded.
Figure 6:
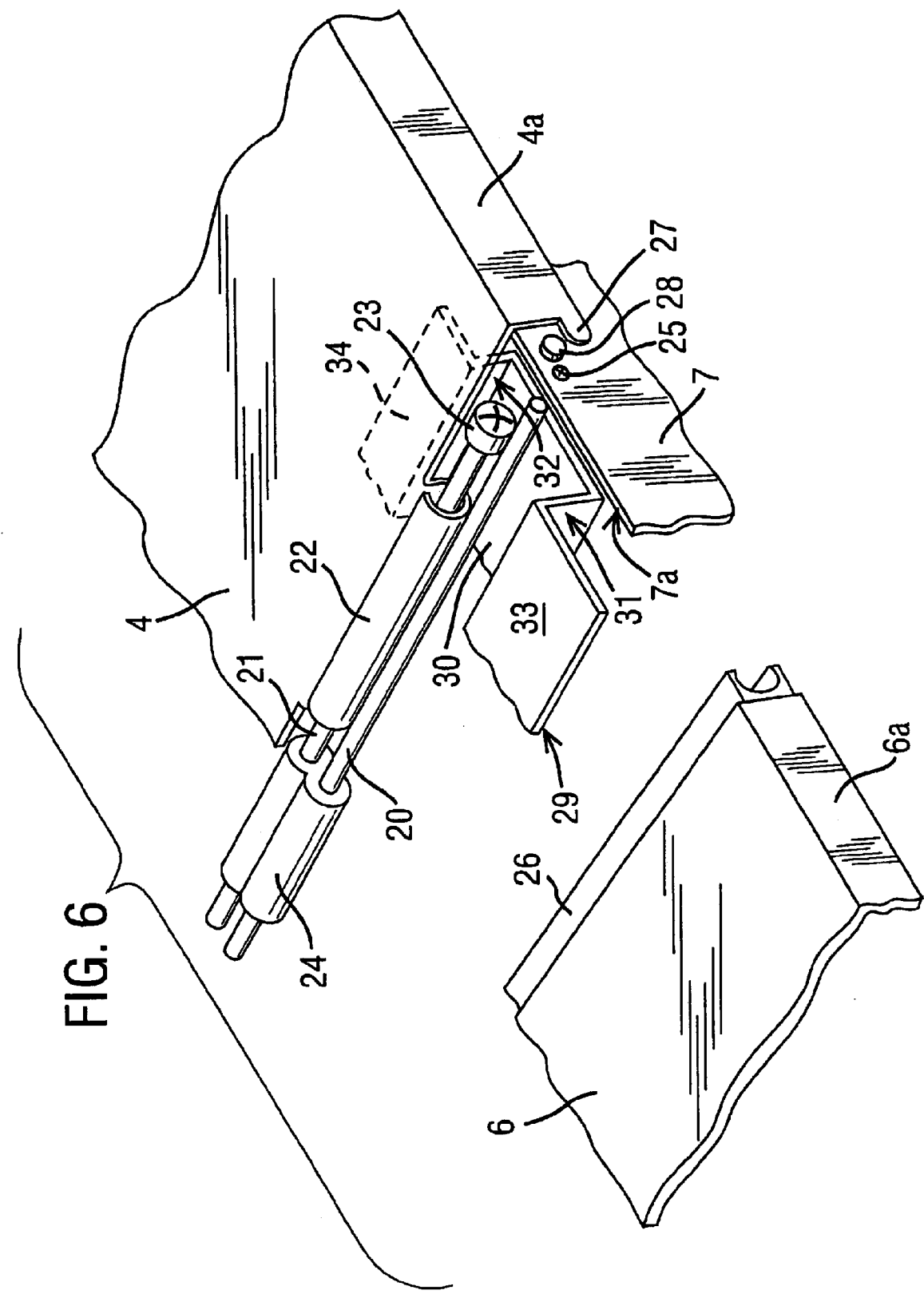
FIG. 6 is a schematic perspective view showing the hinges structure in more detail.

The structure of the hinge is shown in greater detail in FIGS. 5 and 6.

The cover 4 is attached to the sidewalls 7 of the module by means of two substantially parallel hinge rods 20 and 21. One of the hinge rods is a fixed hinge rod 20, fastened at its ends to the sidewalls 7 of the module.

The other hinge rod is a moving hinge rod 21, which extends through tubular extensions 22 formed integrally with the forward edge of the cover 4. The moving hinge rod 21 has enlarged portions 23 at its ends to prevent movement of the hinge rod 21 in its axial direction relative to the cover 4. The enlarged portions 23 may be constituted by the heads of machine screws which are engaged in axially-extending threaded bores in the ends of the movable hinge rod 21.

The fixed hinged rod 20 and movable hinged rod 21 are connected together by hinge pieces 24. The hinge pieces 24 each have a pair of parallel bores to accept respective ones of the fixed and movable hinged rods 20 and 21. The hinge piece 24 is rotatable about the fixed hinge rod 20 relative to the sidewalls of the module, and the hinge pieces 24 allow the movable hinge rod 21 to swing in an arc relative to the sidewalls 7 of the module 2 of approximately 90°. For completeness, it is to be understood that the movable hinge rod 21 is not secured to the sidewalls 7 of the module. The fixed hinged rod 20 may be secured to the sidewalls 7 by a machine screw 25 passing through a bore in the sidewall 7 and engaging a threaded bore in the end of the hinge rod 20. As can be seen in FIG. 5, the rear edge of the fixed panel 6 comprises a number of channel-like projections facing rearwardly from the fixed panel 6. These projections correspond in number and position to the tubular extensions 22 of the cover 4. The hinge pieces 24 are received between the tubular extensions 22.

The extensions 22 are formed by providing tongues of the cover material extending from the forward edge of the cover 6, bending the tongues inwardly of the cover so that they are perpendicular thereto, and then bending the free ends of the tongues outwardly from the cover to form the tubular extensions 22.

In an alternative embodiment, the extensions 22 may be formed from tongues of the cover material by bending the tongues inwardly towards the cover.

To assemble the cover 4 and hinge 8 on the module 2, the hinge pieces 24 are each placed between two extensions 22 of the cover 4, and the movable hinge rod 21 is then inserted through the extensions 22 and through one of the bores of each of the hinge pieces 24. The enlarged portions 23 are then mounted to the movable hinge rod 21 to secure the hinge rod 21 axially relative to the cover 4.

The fixed hinge rod 20 is then inserted through the unoccupied bores of the hinge pieces 24, so as to be axially coextensive with the movable hinge rod 21. The cover 4 is then placed on the module 2, so that the ends of the fixed hinge rod 20 lie between the sidewalls 7 of the module 2. Machine screws 25 are then passed through bores in the sidewalls 7 and engage the ends of the fixed hinge rod 20 to secure the hinge rod 20 to the module.

The fixed panel 6 is then placed on top of the module and slid rearwardly so that the channel projections 26 surround the fixed hinge rod 20 at its regions opposite the tubular extensions 22.

When the cover 4 is opened to the position shown in FIG. 3, the hinge pieces 24 remain stationary relative to the sidewalls 7 and the cover rotates about the movable hinge rod 21.

When the cover is moved from the position shown in FIG. 3 to that shown in FIG. 4, the hinge pieces 24 remain stationary relative to the cover 4, and rotate relative to the fixed hinge rod 20 and the module 2. The spacing between the bores of the hinge pieces, and thus central axes of the two hinge rods is such that rotation of the hinge pieces 24 through approximately 90° will lift the cover 4 to the extent that a full surface contact is achieved between the fixed panel 6 and the cover 4 in the fully open position.

Shown in detail in FIG. 6, the side pieces 4a of the cover 4 each has a cam nose 27 spaced from the plane of the cover 4, and the sidewalls 7 of the module 2 are each provided with an abutment 28. The cam nose 27 and the abutment 28 are so positioned that, when the cover is in its closed position the cam nose 27 engages beneath the abutment 28 to retain the forward edge of the cover 4 closely in engagement with the upper edge 7a of the sidewall 7. When the cover is moved to the position shown in FIG. 3, the cam nose 27 is disengaged from the abutment 28 and thus the movable hinge rod 21 may be lifted by rotation of the hinge pieces 24 to place the cover 4 on top of the fixed panel 6 in the open position.

As the cover is closed from the fully open position shown in FIG. 4 to the position shown in FIG. 3, the hinge pieces 24 rotate with the cover 4 to bring the moving hinge rod 21 to a position between the sidewalls 7. Continued rotation of the cover 4 relative to the movable hinge rod 21 brings the side pieces 4a of the cover 4 down the outside faces of the sidewalls 7, and the cam nose 27 of the cover 4 engages above the abutment 28 of the sidewall 7. This engagement prevents any lifting of the front edge of the cover 4 and the movable hinge rod 21.

In order to provide for electomagnetic screening to the interior of the module 2, a channel section 29 is arranged to extend between the sidewalls 7. The channel section 29 comprises a base 30, a pair of upstanding webs 31 and 32, and outwardly-directed flanges 33 and 34 extending from the upper edges of the webs 31 and 32 respectively. The channel section 29 is made from sheet metal or extruded, and may have a thickness of from about 0.75 mm to 2 mm.

The channel section 29 is mounted to the module 2 so that the flanges 33 and 34 are substantially co-planar with the upper edge 7a of the sidewalls 7. With the cover 4 in the closed position, the underside of the cover 4 engages the flange 34. Likewise, when the fixed panel 6 is mounted to the module, the underside of the fixed panel 6 engages the flange 33 and the channel projections 26 of the fixed panel 6 lie between the webs 31 and 32 of the channel section 29. Likewise, the fixed and movable hinge rods 20 and 21 lie between the webs 31 and 32 of the channel section 29.

Upper surfaces of the flanges 33 and 34 may be formed with dimples or other projections to ensure electrical contact between the flange 33 and the fixed panel 6 and between the flange 34 and the cover 4. In this way, the structure of the joint 8 provides full electromagnetic screening to the interior of the module 2.

The edge of the cover adjacent the hinge 8 is held down onto the sidewalls 7 by the cam noses 27 and abutments 28 when the cover is closed. At the rear edge of the cover, a pair of upwardly-open hook projections 11 are formed on the cover 4, and these are engageable by resilient toggle fasteners 10 mounted to the rear face 9 of the module. When the cover 4 is closed, the toggle fasteners 10 are engaged with the respective hook projections 11 to hold the rear edge of the cover 4 in close engagement with the upper edge of the rear face 9. The upper edges 7a of the sidewalls 7, and the upper edge of the rear face 9 may be provided with electrical contact portions such as resilient spring fingers of the like to contact the underside of the cover 4 to ensure electrical continuity throughout the housing and thus provide effective electromagnetic shielding.

The slide rails 3 (shown in FIG. 1) are arranged so that when the module 2 is pulled from the rack 1 for servicing, the rear face 9 of the module is spaced sufficiently in front of the fascias 5 of neighboring modules to enable the operator to access the toggle fasteners 10 to release them prior to servicing and re-close them afterwards. In an alternative embodiment, the module 2 is made entirely removable from the rack 1 following disconnection of any cables attached to the rear face of the module, so that opening of the cover can be effected at a remote work location where access to the toggle fasteners is facilitated.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

I claim:

1. A housing for a module of a rack-mountable modular electronic circuit, the housing having a substantially planar face and an access opening in said face, and the housing comprising a cover pivotally mounted for movement between a closed position substantially in the plane of said face and covering the access opening and a second position wherein the cover overlies a region of said face adjacent the access opening;

wherein the cover is mounted to the housing by a hinge assembly comprising:
a fixed hinge rod mounted to the housing;
a movable hinge rod extending parallel to the fixed hinge rod and pivotally attached to an edge of the cover;
a number of hinge pieces each having a pair of spaced parallel bores to receive respectively the fixed and movable hinge rods; and
two parallel sidewalls, wherein the fixed hinge rod extends between the sidewalls;

wherein the cover has depending side pieces to engage the sidewalls when the cover is closed; and wherein the side pieces have cam portions at their ends adjacent the hinge, and wherein the sidewalls are formed with abutments engageable by the cam portions to hold the cover against the sidewalls.

2. A housing according to claim 1, wherein the housing comprises fastening elements engageable between the cover and the housing to retain the cover in the closed position.

3. A housing according to claim 2, wherein the fastening elements comprise toggle fasteners.

4. A housing according to claim 2, wherein the fastening elements comprise a latch.

5. A housing according to claim 4, wherein the latch is key- or tool-operated.

6. A housing for a module of a rack-mountable modular electronic circuit, the housing having a substantially planar face and an access opening in said face, and the housing comprising a cover pivotally mounted for movement between a closed position substantially in the plane of said face and covering the access opening and a second position wherein the cover overlies a region of said face adjacent the access opening;

wherein the cover is mounted to the housing by a hinge assembly comprising:
a fixed hinge rod mounted to the housing;
a movable hinge rod extending parallel to the fixed hinge rod and pivotally attached to an edge of the cover;
a number of hinge pieces each having a pair of spaced parallel bores to receive respectively the fixed and movable hinge rods; and wherein the housing comprises a channel section in which the hinge rods are positioned when the cover is in the closed position.

7. A housing according to claim 6, wherein the channel section has a flange engageable with the interior surface of the cover when the cover is in the closed position.

8. A housing according to claim 7, comprising a fixed panel positioned adjacent to and substantially coplanar with the cover when the cover is in the closed position, and wherein the channel section has a second flange in contact with the fixed panel.

* * * * *